United States Patent
Krishna (10) Patent No.: US 9,621,145 B2
(45) Date of Patent: Apr. 11, 2017

(54) SENSE AMPLIFIER LATCH WITH OFFSET CORRECTION

(71) Applicant: Texas Instruments Incorporated, Dallas, TX (US)

(72) Inventor: Kannan Krishna, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/153,028

(22) Filed: May 12, 2016

(65) Prior Publication Data

US 2016/0336933 A1     Nov. 17, 2016

Related U.S. Application Data

(60) Provisional application No. 62/274,017, filed on Dec. 31, 2015, provisional application No. 62/160,430, filed on May 12, 2015.

(51) Int. Cl.
| | |
|---|---|
| *G01R 19/00* | (2006.01) |
| *H03K 5/24* | (2006.01) |
| *H03K 3/356* | (2006.01) |
| *H03K 5/003* | (2006.01) |

(52) U.S. Cl.
CPC ..... *H03K 5/2481* (2013.01); *H03K 3/356121* (2013.01); *H03K 5/003* (2013.01)

(58) Field of Classification Search
CPC .................................................. H03K 5/2481
See application file for complete search history.

(56) References Cited

U.S. PATENT DOCUMENTS 5,182,560 A * 1/1993 Shiwaku ................ G11C 7/062
                                                                         327/51

* cited by examiner

*Primary Examiner* — Daniel Puentes
(74) *Attorney, Agent, or Firm* — Gregory J. Albin; Charles A. Brill; Frank D. Cimino (57) ABSTRACT

A method and device for input offset cancellation utilizing a latched comparator that is configurable as a linear amplifier capable of sampling and cancelling offset in the inputs to the latched comparator. The latched comparator is configured according to three control signals for operation in three operating intervals. During a first operating interval, the latched comparator is configured as a linear amplifier that samples the offset at the inputs to the latched comparator. Based on the sampled offset, the linear amplifier cancels the offset in the inputs to the latched comparator. During a second operating interval, the latched comparator is configured to operate as comparator and the inputs to the latch are reset. During a third interval, the latch resolves the inputs to the comparator and generates an output signal indicating the relative values of the inputs.

20 Claims, 6 Drawing Sheets

SENSE AMPLIFIER LATCH WITH OFFSET CORRECTION

CROSS-REFERENCE TO RELATED APPLICATIONS

This application claims the benefit of U.S. Provisional Application No. 62/274,017, filed Dec. 31, 2015, and to U.S. Provisional Application No. 62/160,430, filed May 12, 2015, the disclosures of which are incorporated herein in their entirety.

TECHNICAL FIELD

The recited claims are directed, in general, to input offset cancellation and, more specifically, to the input offset cancellation in a comparator.

BACKGROUND

Various comparator logic circuits have been developed that can be used to compare two analog input signals and provide a digital output signal indicating which of the two input signals is larger. Comparators are non-linear circuits commonly used to digitize analog signals. The comparator may be combined with a latch, in order to store the value of the digital output resolved by the comparator. Used in this manner, latched comparators are used as components of analog-to-digital converters (ADCs) in a variety of applications.

In order to adapt a latched comparator such that it can evaluate low voltage inputs and generate a relatively large output signal, a latched comparator may be combined with an amplifier. Preceding the latched comparator, the preamplifier provides gain. The combined amplifier based comparator may be used in in memory devices for sensing the voltage of an individual memory cell and providing a digitized logical output representing the state of the memory cell.

An amplifier based comparator consists of pairs of complementary transistors. Manufacturing variances in these transistors results in an input offset voltage that affects the operation of the amplifier based comparator. Such variances in the preamplifier may be amplified, such that the offset of the preamplifier dominates any offset present in the comparator. The input offset voltage is an additional input voltage that must be applied due to these manufacturing variances in order to trigger a change in state in the output of the sense amplifier based comparator. This offset changes the analog value at which the output of a comparator changes between zero and one, thus degrading the accuracy of the sense amplifier based comparator. The greater the offset, the greater the impact on the range of the sense amplifier based comparator. This offset may be accounted for using conventional techniques that cancel the offset.

Conventional input offset cancellation methods may effectively reduce offset, but do so at the expense of speed. In addition to reducing the operating speed of the circuit, conventional input offset cancellation techniques may increase the die area required by the circuit, increase the power requirements of the circuit and/or reduce the range of the inputs to the sense amplifier based comparator.

SUMMARY OF THE INVENTION

A method and device for input offset cancellation in a latched comparator with differential inputs according to various embodiments are disclosed. During a first interval, the latched comparator is configured as a linear amplifier that receives the differential inputs; samples the offset in the differential inputs, the sampling indicating a first offset amount, and cancels the first offset amount in the differential inputs. During a second interval, the latched comparator is configured as a non-linear comparator and the inputs to a latch component of the non-linear comparator are reset. During a third interval, the values of the differential inputs are compared by the non-linear comparator and a value indicating the relative magnitude of the differential inputs is latched by the latch component.

According to various additional embodiments, the latched comparator operates based on a first control signal, a second control signal and a third control signal. According to various additional embodiments, the offset is sampled by a first capacitor of the latched comparator. According to various additional embodiments, the first capacitor is charged using a negative feedback loop of the latched comparator. According to various additional embodiments, the charge of the first capacitor indicates the first offset amount. According to various additional embodiments, the sampling of the offset is concurrent with the cancelling of the first offset amount. According to various additional embodiments, the first control signal directs the latched comparator to operate in the first interval. According to various additional embodiments, the second control signal directs the latched comparator to operate in the second interval. According to various additional embodiments, the third control signal directs the latched comparator to operate in the third interval. According to various additional embodiments, the value latched during the third interval is provided as an output by the latched comparator until the third interval is repeated.

BRIEF DESCRIPTION OF THE DRAWINGS

Having thus described the invention in general terms, reference will now be made to the accompanying drawings, wherein:

DETAILED DESCRIPTION

Various embodiments are described hereinafter with reference to the accompanying drawings. Embodiments may take many different forms and should not be construed as limited to the embodiments set forth herein. Rather, these embodiments are provided to convey the scope of the claimed subject matter to those skilled in the art.

Figure 1:
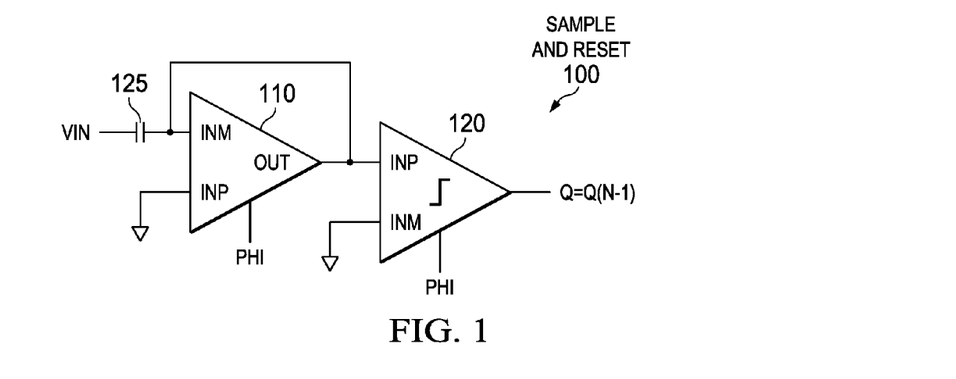
FIG. 1 is a schematic block diagram illustrating one aspect of conventional input offset cancellation in a latched comparator using a preamplifier.
Figure 2:
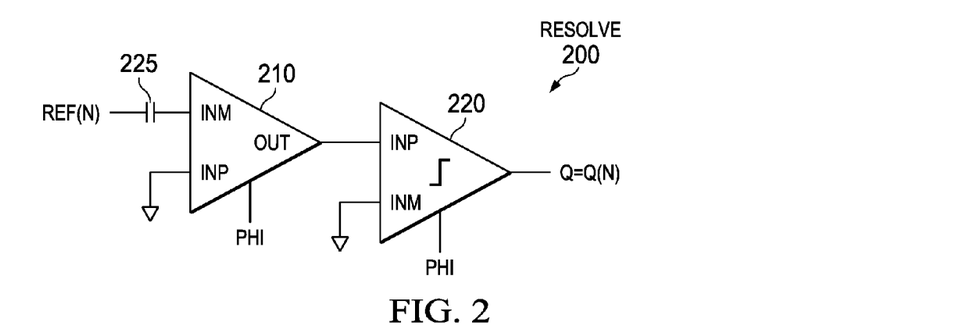
FIG. 2 is a schematic block diagram illustrating another aspect of conventional input offset cancellation in a latched comparator using a preamplifier.

FIGS. 1-2 illustrate the operation of a conventional input offset cancellation technique. In FIG. 1, an amplifier based comparator 100 is configured to utilize a feedback path in order to provide an offset cancellation voltage that is stored in an input capacitor 125. In FIG. 2, the amplifier based comparator 200 has been reconfigured to allow compensation for the offset present at the input of the linear preamplifier 210, with the offset cancellation voltage stored in the input capacitor 225.

FIG. 1 illustrates the first phase of the conventional input offset cancellation technique implemented in an amplifier based comparator 100. A linear preamplifier 110 serves as a first stage of the amplifier based comparator 100 and a latched comparator 120 serves as a second stage. The preamplifier 110 has two input terminals, INM and INP. The INM input terminal preamplifier 110 is connected to an input voltage, $V_{IN}$. A capacitor 125 is connected between the input voltage and the INM terminal. The INP input terminal of preamplifier 110 is grounded, thus configuring the preamplifier 110 to amplify the difference between INM input and ground. The operation of the preamplifier 110 is determined by a control signal, PHI. The amplified output of the preamplifier 110 is provided as an input to the latched comparator 120. In this first phase the output of preamplifier 110 is configured as a unity gain feedback amplifier that samples the offset voltage that is output by preamplifier 110 and stores the sampled offset voltage in capacitor 125.

FIG. 2 illustrates the second phase of the conventional input offset cancellation technique. In the second phase, the latched comparator 220 is used to determine if the amplified input, INP, received from the preamplifier 210 is greater than the reference voltage input, INM. As illustrated, during this second phase, the preamplifier 210 is reconfigured as an open-loop amplifier. Configured in this manner, the offset stored in capacitor 225 is thus subtracted from the input signal INM, resulting in the canceling of the offset at the output, OUT, of the preamplifier 210. In the latched comparator 220, the reference voltage input, INM, is grounded. The latched comparator 220 utilizes a latch mechanism to store the results of this comparison between the INP and INM input voltages. The latched comparator 220 stores a high or low value depending on the outcome of this comparison, with the stored value provided as an output digital signal, Q, by the latched comparator. Like the preamplifier 210, the operation of the latched comparator 220 is also determined by a control signal, PHI.

Figure 3:
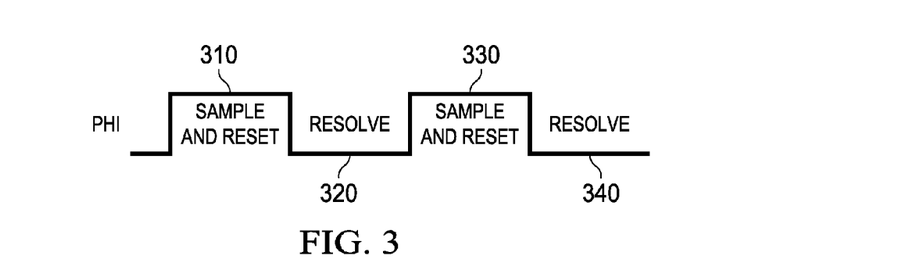
FIG. 3 is a waveform diagram illustrating the operation of a latched comparator using a preamplifier in conventional input offset cancellation.

FIG. 3 illustrates the operation of the input offset cancellation technique of FIGS. 1-2. FIG. 3 depicts a waveform of the control signal, PHI, that is provided as an input to both preamplifier 110, 210 and latched comparator 120, 220. FIG. 3 also depicts the operating state of the input offset cancellation technique based on the state of the control signal, PHI. When the PHI control signal is high, such as during intervals 310 and 330 depicted in FIG. 3, the latched comparator is reset, if necessary, and the offset of preamplifier 110 is sampled and stored in capacitor 125 via a feedback mechanism. When the PHI control signal goes low, such as during intervals 320 and 340, the offset stored in capacitor 225 cancels the offset at the output, OUT, of linear preamplifier 210. With the offset of linear preamplifier cancelled, latched comparator 220 resolves whether the input, INP, is larger than the reference voltage, INM.

Using this conventional offset cancellation technique, the offset of preamplifier 110 is eliminated from the input provided to the latched comparator 120. However, the operating speed of this conventional offset cancellation technique is limited by the output slew rate of the preamplifier 110. Consequently, this conventional offset cancellation technique illustrated in FIGS. 1-3 results in a loss of speed in the amplifier based comparator. This form of conventional offset cancellation also requires additional power consumption and additional die area for the implementation of the separate preamplifier stage.

In another conventional form of input offset cancellation, a linear comparator is utilized rather than a linear preamplifier. The offset of the linear comparator is cancelled using input referred offset cancellation. This technique requires additional power and results in a greater speed loss than input offset cancellation technique of FIGS. 1-3.

Another conventional form of input offset cancellation in a latched comparator utilizes post-processing to cancel offset. The post-processing requires determining the magnitude of the offset of a latched comparator. The magnitude of the offset is stored and utilized during the operation of the comparator to subtract the offset from the values resolved by the latched comparator. This post-processing input offset cancellation technique results in a loss of range unless larger, slower components are utilized to provide more headroom.

Figure 4:
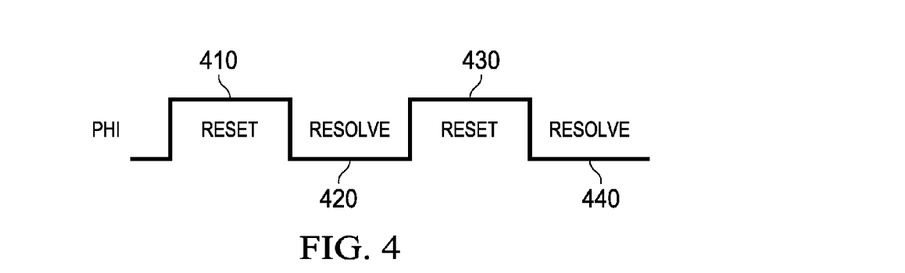
FIG. 4 is a waveform diagram illustrating the operation of a conventional latched comparator without input offset cancellation.
Figure 5:
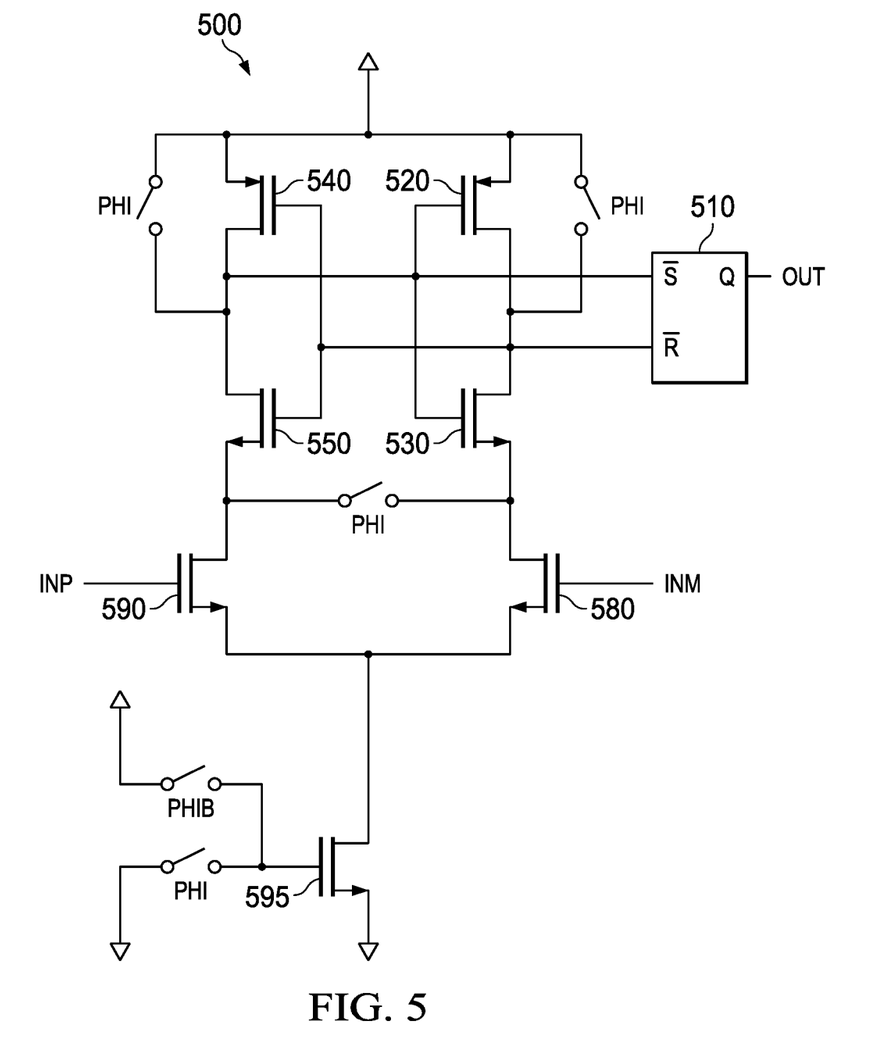
FIG. 5 is a schematic circuit diagram illustrating a conventional latched comparator that does not utilize input offset cancellation.

FIGS. 4 and 5 illustrate a more detailed description of the operation of a conventional latched comparator 500. FIG. 5 is circuit diagram of a latched comparator 500 used in a conventional sense amplifier based comparator. FIG. 4 illustrates the two phases of the operation of the conventional latched comparator 500. In particular, FIG. 4 depicts a waveform of the clocked control signal, PHI, that is provided as an input to the latched comparator. FIG. 4 also depicts the operating state of the latched comparator based on the state of the control signal, PHI. When the PHI control signal is high, such as during intervals 410 and 430 depicted in FIG. 4, the latched comparator 500 is in a reset phase. During the reset phase, the comparator component of the latched comparator 500 is reset by shorting the drains of input transistors 580 and 590, such that two inputs to the latch component 510 are equalized. During this phase of resetting the comparator inputs, the latch component 510 maintains its previously latched value. When the PHI control signal is low, such as during intervals, 420 and 430, the latched comparator 500 resolves a new digital value to be latched, where the latched value is resolved based on the comparison of the inputs received at transistors 580 and 590.

The conventional sense amplifier based comparator 500 is a CMOS circuit that includes cross-coupled PMOS and NMOS transistors 520, 530, 540, 550 and a differential pair of input transistors 580 and 590. Based on the state of the control signal PHI, transistor 595 couples and decouples the differential pair of transistors 580 and 590 to ground. When the control signal, PHI, is high, such as during intervals 410 and 430, the inputs received at $\overline{R}$ and $\overline{S}$ terminals of the latch component 510 are reset and the current flowing through input transistors 580 and 590 at the end of the reset phase is determined based on the gate voltages provided by their respective inputs, INM and INP. When the control signal PHI is low, such as during intervals 420 and 440, the voltages at terminals $\overline{R}$ and $\overline{S}$ are resolved in order to ascertain the relative values of these two terminals. If the voltage on input terminal INP is greater than the voltage on terminal INM, the $\overline{S}$ terminal is low and $\overline{R}$ terminal is high. When voltage on input terminal INP is less than the voltage on input terminal INM, the $\overline{S}$ terminal is high and the $\overline{R}$ terminal is low. Based on these inputs at the $\overline{R}$ and $\overline{S}$ terminals, the latch output is then determined.

FIGS. 6-9 illustrate input offset cancellation using a configurable sense amplifier latch according to various embodiments. In the illustrated embodiment of FIGS. 6-9 and in FIGS. 10-11, input offset cancellation is described with respect to a latched comparator. However, various embodiments may utilize the described cancellation of input offset in other types of comparators that utilize a clocked control signal. According to various embodiments, input offset cancellation is provided without the use of a dedicated preamplifier stage. Instead, input offset is cancelled in embodiments by re-configuring the latched comparator, which is a non-linear device, as a linear amplifier during an offset cancellation phase. Upon cancellation of the offset, the comparator is reconfigured operate as a non-linear comparator. In this manner, embodiments provide the ability to cancel offset using a single, configurable comparator component.

Figure 6:
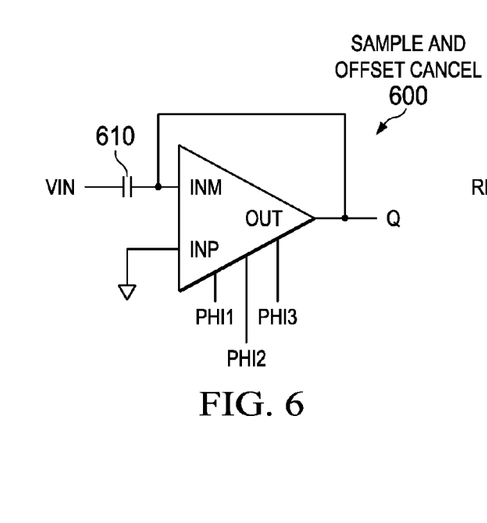
FIG. 6 is a schematic block diagram illustrating one aspect of input offset cancellation according to various embodiments.
Figure 7:
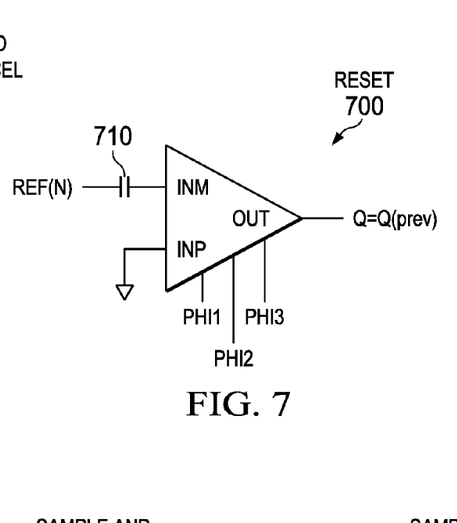
FIG. 7 is a schematic block diagram illustrating another aspect of input offset cancellation according to various embodiments.
Figure 8:
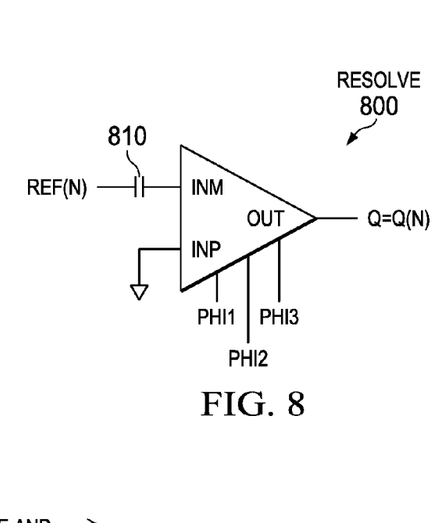
FIG. 8 is a schematic block diagram illustrating another aspect of input offset cancellation according to various embodiments.
Figure 9:
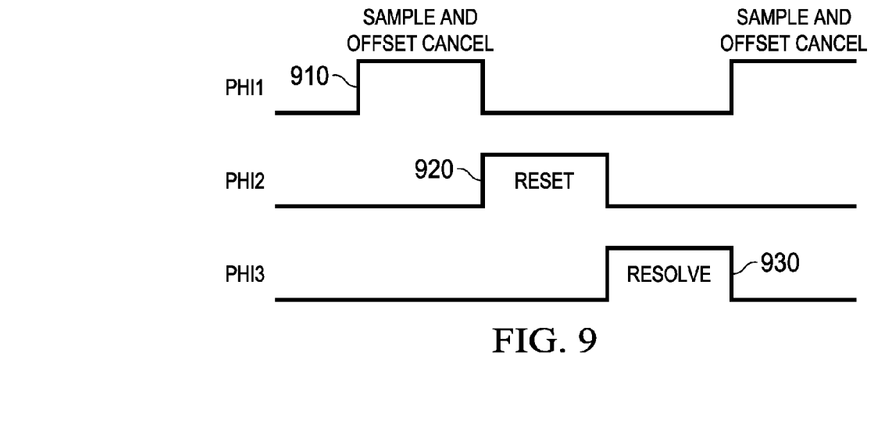
FIG. 9 is a waveform diagram illustrating the operation of a sense amplifier latch utilizing input offset cancellation according to various embodiments.

FIGS. 6-8 illustrate input offset cancellation in a sense amplifier latch with three-phase offset correction according to various embodiments. FIG. 9 depicts a waveform of three clocked control signals, PHI1, PHI2 and PHI3, that are provided according to various embodiments as inputs to a sense amplifier latch and used to signal each of the three phases of operation of the sense amplifier latch. FIG. 9 also depicts the operating state transitions of the sense amplifier latch that result from the state of the control signals, PHI1, PHI2 and PHI3.

FIG. 6 depicts the configuration according to various embodiments of a sense amplifier latch 600 during the first phase of a three-phase offset cancellation technique. Unlike the conventional two-component system of FIGS. 1-2, the sense amplifier latch 600 is a single component that both provides comparator functions and includes input offset cancellation capabilities. The sense amplifier latch 600 has two input terminals, INM and INP. The INM input terminal is connected to an input voltage, $V_{IN}$, via a capacitor 610. The INP input terminal is grounded. The operation of the sense amplifier latched 600 is determined based on the three control signals, PHI1, PHI2 and PHI3. Based on the control signal, PHI1, PHI2 or PHI3, that is applied, the sense amplifier latch is reconfigured to provide the offset cancellation and latched comparator functionality that is used in each of the three phases.

FIG. 9 illustrates the operation of an three-phase input offset cancellation technique that is implemented by a sense amplifier latched configured according to embodiments, such as described with respect to FIGS. 6-8. FIG. 9 depicts a waveform of the control signals, PHI1, PHI2 and PHI3, that are utilized as inputs to the sense amplifier based latched comparator of FIGS. 6-8. FIG. 9 also depicts the operating state of the recited input offset cancellation technique based on the states of the control signals, PHI1, PHI2 and PHI3.

When the PHI1 control signal is high, such as during interval 910 depicted in FIG. 9, the recited input offset cancellation technique begins and the offset between the INM and INP inputs is sampled. As illustrated in FIG. 6, during this first phase of interval 910, the sense amplifier latch 600 is configured as a linear amplifier and the offset between the INM and INP inputs is concurrently sampled and cancelled. The sense amplifier latch 600 is configured as a linear amplifier by connecting a negative feedback loop to the INM input terminal. In certain embodiments, the sense amplifier latch 600 may be configured as a linear amplifier using a switch configured to establish a feedback connection between the OUT output terminal and the INM input terminal of the sense amplifier latch 600. Via the feedback loop utilized during this first phase, the offset between the INM and INP input terminals is stored in capacitor 610, thus sampling the magnitude of the input offset of the sense amplifier latch 600. While configured as a linear amplifier in interval 910, the sense amplifier latch 600 cancels the input offset between the INM and INP input terminals, since the input to INM is equal to $V_{IN}$ minus the value stored by capacitor 610, which is $V_{IN}$ minus the offset voltage.

FIG. 7 depicts the configuration of a sense amplifier latch 700 according to various embodiments during the second phase of a three-phase offset cancellation technique. With reference to the control signal waveforms of FIG. 9, in this second phase corresponding to interval 920, the PHI1 control signal goes low and the PHI2 control signal goes high. During this second phase of interval 920, the latch component of the sense amplifier latch 700 is reset. As illustrated in FIG. 7, during this reset interval 920, the feedback loop that configures the sense amplifier latch 700 as a linear amplifier is disconnected. In certain embodiments, the feedback loop may be disconnected by opening a switch coupled between the OUT output terminal and the INM input terminal of the sense amplifier latch 700. Upon disconnecting the feedback loop, the sense amplifier latch 700 becomes configured to function as a latched comparator that is configured to reset the inputs to the latch component utilized by the sense amplifier latch. During interval 920, the output terminal, OUT, of the sense amplifier latch 700 is the value that was latched during the previous iteration of the recited input offset cancellation technique.

FIG. 8 depicts the configuration of a sense amplifier latch 800 according to various embodiments during the third phase of a three-phase offset cancellation technique. With reference to the control signal waveforms of FIG. 9, in this second phase corresponding to interval 930, the PHI2 control signal goes low and the PHI3 control signal goes high. During interval 930, the new output of the sense amplifier latch 800 is resolved. As described below, the sense amplifier latch 800 is configured as a comparator that generates a digital output, OUT, that reflects the relative values of the INM and INP input terminals.

Figure 10:
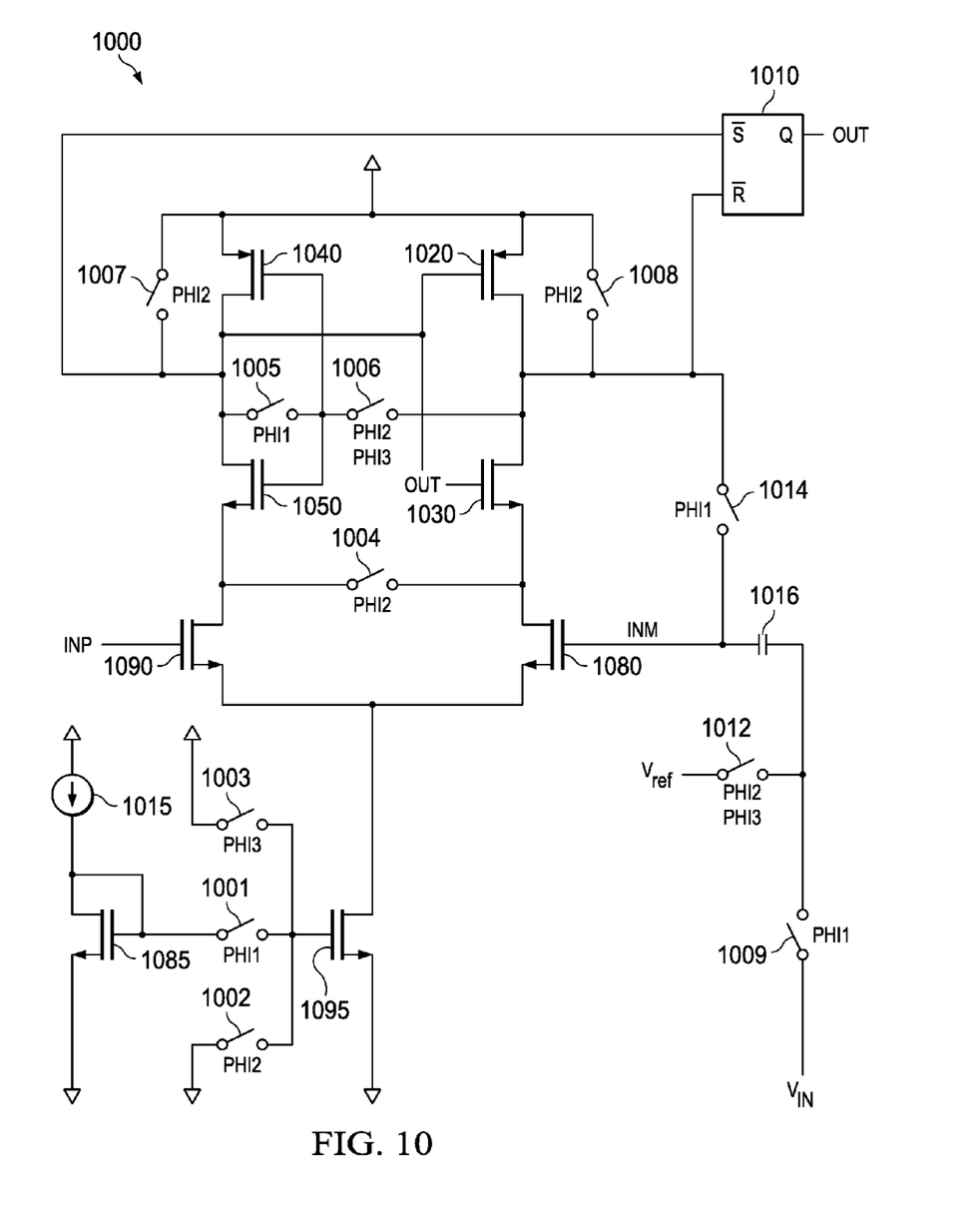
FIG. 10 is a schematic circuit diagram illustrating a sense amplifier latch that utilizes input offset cancellation according to various embodiments.
Figure 12:
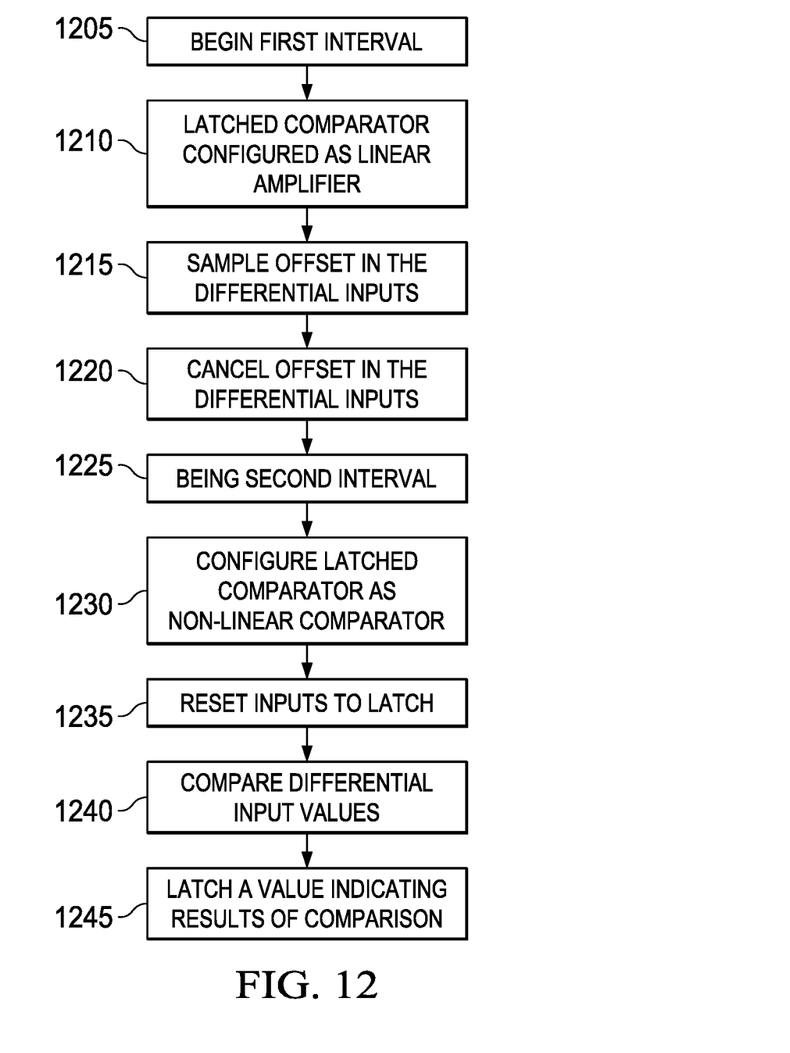
FIG. 12 is flowchart depicting certain steps of process for input offset cancellation according to various embodiments.

FIGS. 6-8 depict a high-level view of the three phases of operation of a sense amplifier latch configured to provide offset correction according to various embodiments. FIG. 10 is circuit diagram that provides a more detailed view of a sense amplifier latch 1000 implemented according to various embodiments. FIG. 12 illustrates certain steps by which a sense amplifier latch, such as sense amplifier latch 1000, may be utilized in three-phase input offset cancellation. FIG. 10 also illustrates the role of the three control signals PHI1, PHI2 and PHI3 in the configuration of the three-phase, sense amplifier latch. The control signals may be generated according to various embodiments using a state machine or software routine that is programmed to implement the logic described herein. In certain embodiments, the edges of PHI1, PHI2 and PHI3 are appropriately sequenced to avoid charge injection errors.

The sense amplifier latch 1000 is a CMOS circuit that includes cross-coupled PMOS and NMOS transistors 1020, 1030, 1040, 1050 and a differential pair of input transistors 1080 and 1090, with the gate voltage of each input transistor provided by inputs INP and INM, respectively. The sense amplifier latch 1000 also includes a latch component 1010 that is configured to store the results of the comparison of input signal, INP and INM. More specifically, the output of the latch component 1010 is a digital output signal, Q, that reflects the comparison of the voltages provided by the input signals, INP and INM, made by the comparator function that is implemented by the cross-coupled transistors 1020, 1030, 1040 and 1050 of the sense amplifier latch 1000.

In the illustrated embodiment, two different voltage input sources are utilized in the operation of the sense amplifier latch 1000 in three phases of the described offset correction technique. During the first phase of sampling and cancelling the input offset, input voltage, $V_{IN}$ is provided to the sense amplifier latch 1000 via the operation of switch 1009. In certain embodiments, $V_{IN}$ may be an input voltage to be sampled and converted to a digital code. During the second and third phases, a reference voltage, $V_{ref}$ is provided to the sense amplifier latch via the operation of switch 1012. In certain embodiments, this reference voltage, $V_{ref}$, may be generated as an output of a digital-to-analog converter which determines the digital codes that correspond to particular voltage values. In certain embodiments, the digital-to-analog converter generating the reference voltage may be a component of an N-bit SAR (successive approximation register) analog-to-digital converter. In such scenarios, input offset cancellation may be provided in certain embodiments using a single PHI1, phase that is followed by N sequences of PHI2 and PHI3 phases, where each sequence is associated with a different $V_{ref}$ value corresponding to each of the N bits that is being resolved.

Input offset cancellation begins at step 1205 with the beginning of the first interval. The three-phase sense amplifier latch 1000 is configured to sample and store an offset cancellation voltage during the first phase of the offset cancellation technique. As described with respect to FIGS. 6 and 9, during interval 910 the offset cancellation voltage is stored in a capacitor 610 preceding the INM terminal. In the sense amplifier latch 1000, the offset cancellation voltage is stored in capacitor 1016 that precedes the INM terminal. During this first phase of the offset cancellation technique, the PHI1, control signal is high, thus configuring the sense amplifier latch 1000 as a linear amplifier at step 1210. Also during this first phase, the feedback loop used in storing the offset cancellation voltage is established in capacitor 1016 via the toggling of PHI1, switch 1014.

In the illustrated embodiment, the configuration of the sense amplifier latch 1000 as a linear amplifier includes the toggling of PHI1, switch 1001, thus resulting in the supply of tail current source 1015 and triggering the gate of transistor 1095. The closing of the PHI1, switch 1001 may result in transistors 1085 and 1095 forming a current mirror. The current mirror may receive an input current at the drain of transistor 1085 from current source 1015, and generate an output current at the drain of transistor 1095. The output current may serve as a bias current for the linear amplifier configured in this first phase. In addition, during interval 910, PHI1, switch 1005 is toggled, while PHI2/PHI3 switch 1006 remains open, thus decoupling the gates of transistors 1040, 1050 from the drains of transistors 1020, 1030, thereby forming a linear amplifier that uses the current generated by the current mirror as a bias current. As described with respect to FIGS. 6-9, during intervals where PHI1, is logically high, the offset of inputs, INP and INM, of the latched comparator 1000 are sampled at step 1215 and this sampled offset amount is subtracted at step 1220 from the INM input terminal, thus cancelling the offset between the INP and INM inputs.

At step 1225, the second interval begins. As described with respect to FIGS. 7 and 9, during the second phase of the offset cancellation technique, such as during interval 920, the inputs to the latch component used by the sense amplifier latch are reset. In the sense amplifier latch 1000 of FIG. 10, the second phase is configured by first toggling PHI1, switches 1009, 1005 and 1014, thus removing the feedback loop used to store the offset cancellation voltage during the first phase and switching from the input voltage $V_{IN}$ used for input offset cancellation and the reference voltage, $V_{ref}$, that will be provided as a comparator input. In the second phase, the sense amplifier latch 1000 is reconfigured as a non-linear comparator at step 1230 and at step 1235 the inputs to the latch component 1010 are reset. During this reset phase, PHI2 switches 1007 and 1008 are toggled such that the inputs to the $\overline{R}$ and $\overline{S}$ terminals are coupled to a high supply voltage and both of the inputs to the latch component 1010 have high logic values. These high logic value inputs result in the latch component 1010 maintaining its previous state as an output Q.

Also during this second phase, PHI2 switches 1004, 1006, 1002, 1007, 1008 and 1012 are toggled. The toggling of PHI2 switch 1004 results in the drains of input transistors 1080 and 1090 being shorted, such that these two inputs to the latch component 1010 are equalized. The duration of interval 920 is selected in order to allow sufficient time for the inputs to terminals $\overline{R}$ and $\overline{S}$ to be reset and to reach a steady-state. In the illustrated embodiment, the comparator function of the sense amplifier latch 1000 is configured as a non-linear latched comparator during the second phase based in part on the toggling of PHI2 switch 1006 to couple the gates of transistors 1040, 1050 to the drains of transistors 1020, 1030. Also during this second phase, the PHI2 switch 1002 is toggled, which grounds the gate terminal of transistor 1095 and allows the reset of the latch inputs. During this second phase, PHI2 switch 1012 is toggled in order to replace the offset cancellation voltage with the reference voltage that will be the INM terminal input that will be compared against the INP terminal input.

At step 1240, the third interval begins. As described with respect to FIGS. 8 and 9, during the third phase of the offset cancellation technique, such as during interval 930, the inputs to the latch component 1010 are resolved in order to determine the new output Q. In the sense amplifier latch 1000 of FIG. 10, the third phase is configured by first toggling PHI2 switches 1004, 1006, 1007, 1008 and 1002 that were utilized in the second phase. At step 1245, the sense amplifier latch 1000 resolves the values of the inputs at the $\overline{R}$ and $\overline{S}$ terminals of the latch component 1010 based on the comparison of the INP and INM inputs by the comparator function of the sense amplifier latch. During this third phase, PHI3 switch 1012 remains toggled, thus maintaining the reference voltage for comparison on input terminal INM.

Also during this third phase, PHI3 switch 1006 remains toggled, thus providing the comparator output to the latch component 1010. The sense amplifier latch 1000 resolves the $\overline{R}$ and $\overline{S}$ inputs of the latch component 1010 to opposite digital values (1 and 0, or 0 and 1) based on whether the INP input is greater than or less than the INM input, resulting in a digital input on the R̄ and S̄ inputs to the latch component 1010. If the voltage on input terminal INP is greater than the voltage on terminal INM, the S̄ terminal will resolve to a logical low value and the R̄terminal will resolve to a logical high. Conversely, when the voltage on input terminal INP is less than the voltage on terminal INM, the S̄ terminal will resolve to logical high value and the R̄terminal will resolve to a low value. At step 1250, the latch component 1010 latches the digital value (1 or 0) that reflects the inputs received at the R̄ and S̄ terminals. The duration of interval 930 is selected to allow sufficient time for the inputs to terminals R̄ and S̄ to be resolved and stored by the latch component 1010. During interval 930, the PHI3 control signal is high, which connects the gate terminal of transistor 1095 to a supply voltage, thus enabling the resolution of the R̄ and S̄ input terminals by the latch component 1010.

Figure 11:
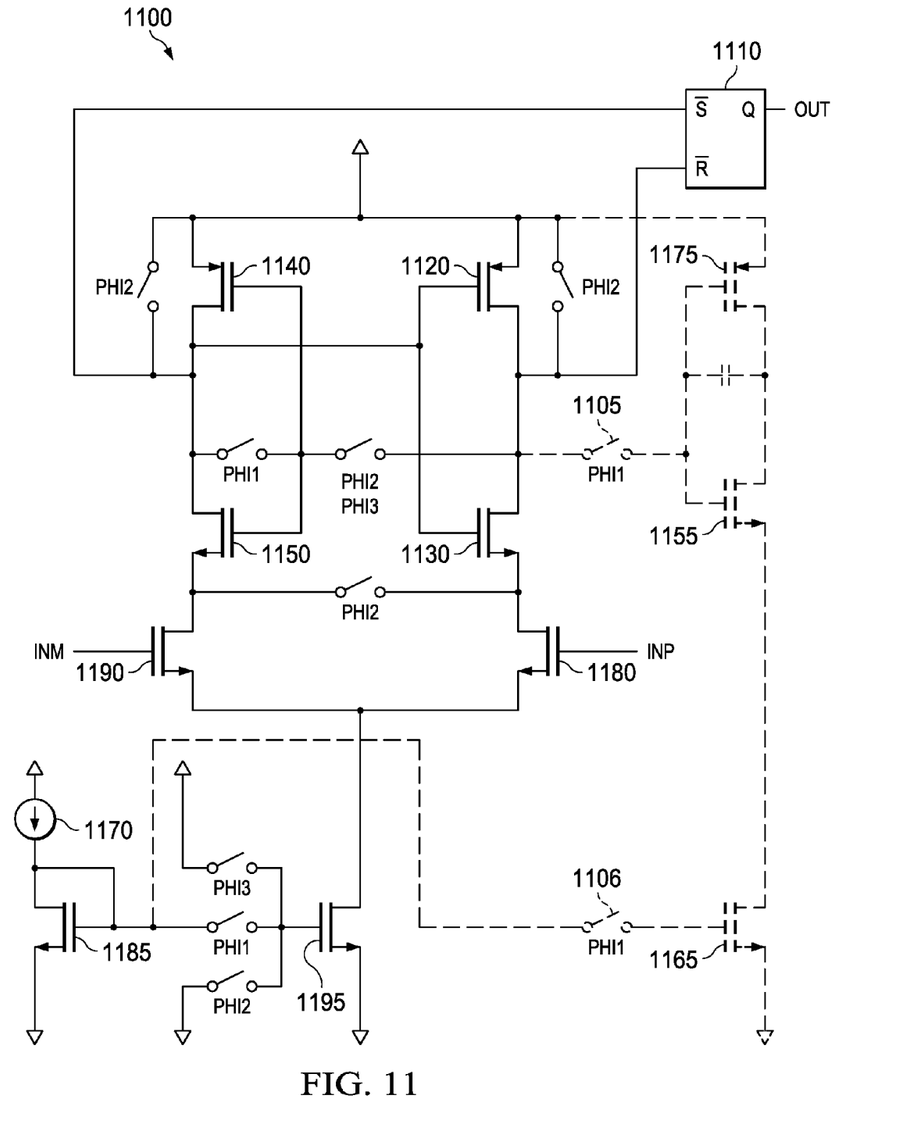
FIG. 11 is a schematic circuit diagram illustrating a sense amplifier latch that utilizes input offset cancellation and an additional gain stage according to various additional embodiments.

FIG. 11 illustrates the circuit diagram of an additional embodiment of an sense amplifier latch 1100 that is configured to utilize an additional gain stage is situations where the configured linear amplifier does not generate sufficient gain. The feedback pathways and voltage inputs, $V_{IN}$ and $V_{ref}$, of FIG. 10 are not included in FIG. 11 for clarity sake, but the embodiment of FIG. 11 also utilizes these aspects of the embodiment of FIG. 10. As with the embodiment of FIG. 10, the latched comparator is a CMOS circuit that includes cross-coupled PMOS and NMOS transistors 1120, 1130, 1140, 1150 and a differential pair of input transistors 1180 and 1190, each transistor controlled by inputs INP and INM, respectively. As with FIG. 10, the sense amplifier latch 1100 also includes a latch component 1110 that is configured to store the results of the comparison of input signal, INP and INM. More specifically, the output of the latch component 1110 is a digital output signal, Q, that reflects the comparison of the voltages provided by the input signals, INP and INM, made by the comparator function that is implemented by the cross-coupled transistors 1120, 1130, 1140 and 1150 of the sense amplifier latch 1100.

The sense amplifier latch 1100 operates in the same manner as the embodiment with FIG. 10 with respect the PHI1, PHI2 and PHI3 control signals, except for the configuration of an additional gain component 1175 by switches 1105 and 1106 during the sampling and cancelling interval when PHI1 is logically high. The latched comparator 1100 employing this additional gain component comprised of transistors 1155, 1165 and 1175 may be especially useful in scenarios where the INM and INP inputs are generated by relatively high voltage components (potentially operating at 7V or 5V) and the load connected to the latched comparator is a relatively low voltage component (potentially operating at 1.5V or 1.2V). In such scenarios, the offset in the inputs, INM and INP, will be dominated by the high-voltage input devices, thus resulting in low gain by the configured linear amplification stage used by the latched comparator 1100.

The various described embodiments may provide significant improvements over conventional input offset cancellation with regard to speed and power consumption. As described, conventional input offset cancellation techniques may rely on a linear preamplifier stage. By utilizing a single integrated comparator component that can be reconfigured to function as a linear amplifier, significantly smaller and faster components can be utilized. In addition, when compared to conventional use of a preamplifier stage, embodiments provide improved linearity in the cancellation of input offset to a comparator device. Due to integration of the linear amplifier, the input capacitance of the comparator is lowered compared to conventional offset cancellation techniques that utilize a separate preamplifier stage. By lowering the input capacitance, smaller capacitors can be utilized, thus further improving the speed of the offset cancellation.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A method for input offset cancellation in a latched comparator that receives differential inputs, the method comprising:
during a first interval:
configuring the latched comparator as a linear amplifier that receives the differential inputs;
sampling, by the linear amplifier, an offset in the differential inputs to the linear amplifier, the sampling indicating a first offset amount; and
cancelling, by the linear amplifier, the first offset amount in the differential inputs;
during a second interval:
configuring the latched comparator as a non-linear comparator; and
resetting inputs to a latch component of the non-linear comparator;
during a third interval:
comparing, by the non-linear comparator, values of the differential inputs;
latching, by the latch component, a value indicating a relative magnitude of the differential inputs.

2. The method of claim 1, wherein the latched comparator operates based on a first control signal, a second control signal and a third control signal.

3. The method of claim 1, wherein the offset is sampled by a first capacitor of the linear amplifier.

4. The method of claim 3, wherein the first capacitor is charged using a feedback loop of the linear amplifier.

5. The method of claim 4, wherein a charge of the first capacitor indicates an input voltage minus the first offset amount.

6. The method of claim 1, wherein the sampling of the offset is concurrent with the cancelling of the first offset amount.

7. The method of claim 2, wherein the first control signal directs the latched comparator to operate in the first interval.

8. The method of claim 7, wherein the second control signal directs the latched comparator to operate in the second interval.

9. The method of claim 8, wherein the third control signal directs the latched comparator to operate in the third interval.

10. The method of claim 1, wherein the value latched during the third interval is provided as an output by the latched comparator until the third interval is repeated.

11. A latched comparator providing input offset cancellation, the latched comparator comprising:
terminals operable for receiving differential inputs;
a capacitor operable for storing an offset cancellation voltage;
a comparator,
wherein the comparator is configured during a first interval as a linear amplifier operable for receiving the differential inputs, sampling an offset in the differential inputs to determine a first offset amount, and cancelling the first offset amount in the differential inputs, wherein the comparator is configured during a second interval as a non-linear comparator, wherein the non-linear comparator is operable, during a third interval, for comparing values of the differential inputs; and a latch component, wherein the inputs to the latch component are reset during the second interval and a value indicating a relative magnitude of the differential inputs is latched by the latch component during the third interval.

12. The latched comparator of claim 11, wherein the latched comparator operates based on a first control signal, a second control signal and a third control signal.

13. The latched comparator of claim 11, wherein the offset is sampled by a first capacitor of the latched comparator.

14. The latched comparator of claim 13, wherein the first capacitor is charged using a feedback loop of the latched comparator.

15. The latched comparator of claim 14, wherein a charge of the first capacitor indicates the first offset amount.

16. The latched comparator of claim 11, wherein the sampling of the offset is concurrent with the cancelling of the first offset amount.

17. The latched comparator of claim 12, wherein the first control signal directs the latched comparator to operate in the first interval.

18. The latched comparator of claim 17, wherein the second control signal directs the latched comparator to operate in the second interval.

19. The latched comparator of claim 18, wherein the third control signal directs the latched comparator to operate in the third interval.

20. The latched comparator of claim 11, wherein the value latched during the third interval is provided as an output by the latched comparator until the third interval is repeated.

* * * * *